(12) United States Patent
Shpitzer

(10) Patent No.: US 10,568,215 B1
(45) Date of Patent: Feb. 18, 2020

(54) PCBA ENCAPSULATION BY THERMOFORMING

(71) Applicant: Flex Ltd., Singapore (SG)

(72) Inventor: Yitzchak Shpitzer, Haifa (IL)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/417,397

(22) Filed: May 20, 2019

(51) Int. Cl.
*H05K 3/28* (2006.01)
*H05K 1/02* (2006.01)
*H05K 1/18* (2006.01)

(52) U.S. Cl.
CPC ......... *H05K 3/284* (2013.01); *H05K 1/0272* (2013.01); *H05K 1/181* (2013.01)

(58) Field of Classification Search
CPC ....... H05K 3/284; H05K 1/0272; H05K 1/181
USPC ...................................................... 174/251
See application file for complete search history.

(56) References Cited

U.S. PATENT DOCUMENTS

| | | | |
|---|---|---|---|
| 6,035,524 A * | 3/2000 | Suppa | G05B 19/4207 174/16.3 |
| 6,518,677 B1 | 2/2003 | Capote | |
| 8,034,447 B2 | 10/2011 | Sakai | |
| 8,450,848 B2 | 5/2013 | Sakurai | |
| 8,497,579 B1 | 7/2013 | Shih | |
| 8,728,865 B2 | 5/2014 | Haba | |
| 8,928,865 B2 | 1/2015 | Rakuljic | |
| 8,970,051 B2 | 3/2015 | Shi | |
| 2002/0056906 A1 | 5/2002 | Kajiwara | |
| 2004/0224441 A1 | 11/2004 | Saito | |
| 2005/0039945 A1 | 2/2005 | Matsuda | |
| 2008/0282540 A1 * | 11/2008 | Singleton | B29C 45/14647 29/856 |
| 2009/0029504 A1 | 1/2009 | Paik | |
| 2015/0257278 A1 * | 9/2015 | Niskala | H05K 3/1216 361/749 |

* cited by examiner

*Primary Examiner* — Sherman Ng
(74) *Attorney, Agent, or Firm* — Haverstock & Owens LLP

(57) ABSTRACT

An encapsulated circuit board assembly has a circuit board assembly that includes a substrate with a first surface and one or more electronic components mounted to the first surface to form an irregularly contoured front side of the circuit board assembly. A thermoformed sheet encapsulates the irregularly contoured front side of the circuit board assembly. Vacuum forming and pressure forming methods are used to apply a thermoformable sheet to the irregularly contoured front side of the circuit board assembly.

17 Claims, 3 Drawing Sheets

PCBA ENCAPSULATION BY THERMOFORMING

FIELD OF THE INVENTION

The present invention is generally directed to the field of printed circuit board assemblies (PCBAs). More specifically, the present invention is directed to systems and methods for PCBA encapsulation by thermoforming.

BACKGROUND OF THE INVENTION

In many applications, a PCBA is encapsulated to protect attached components, interconnects between components and between components and the PCB, and the PCB itself from environmental conditions, such as humidity. The PCBA can be encapsulated using a coating material that is either sprayed or brushed onto the PCBA, which forms a conformal film. First the surface is cleaned, then the conformal film is applied. A disadvantage of a conformal film encapsulation is that mechanical resistance, such as resistance to abrasion, is lacking. For example, if the conformal film is scratched, there is a high likelihood that the conformal film will be peeled off and the underlying PCBA surface/components penetrated. As such, the conformal film is effective for humidity resistance, but not mechanical resistance. However, even for humidity resistance, conformal film provides limitations. For example, application of the coating material is not always uniform or complete, and therefore the conformal film coverage may not be uniform and there may be coverage incompleteness in some areas that require re-application of the coating material.

Thermoforming is a manufacturing process where a plastic sheet is heated to a sufficient temperature that permits the heated plastic sheet to be stretched into or onto a mold and cooled to a finished shape. Vacuum forming is a simplified version of thermoforming, where a plastic sheet is heated to a forming temperature, stretched onto a single-surface mold, and forced against the mold by a vacuum. Relatively deep contours can be formed if the plastic sheet is stretched prior to bringing it into contact with the mold surface and applying vacuum. Vacuum forming is a process currently used to form variously shaped objects, such as disposable cups or substrates in In-Mold Electronics (IME) having 2D or 2.5D shapes. In IME, a thermoformable plastic sheet is used as a base substrate. Stretchable conductive ink is screen printed onto the thermoformable plastic sheet to form conductive traces, or interconnects, prior to the thermoforming process, then the thermoformable plastic sheet is thermoformed. Components are then added to the thermoformed substrate. Lastly, the thermoformed substrate with attached components is placed in a mold, and an overmold layer is applied over the components and thermoformed substrate using an injection molding process.

At present, overmolding a PCBA by placing the PCBA in a mold and performing injecting molding can be performed, but there are significant risks for the PCBA. Risks include damage to the components due to the heat and pressure, components disconnecting from the PCB due to the plastic material flow, PCBA deformation, and the like.

SUMMARY OF THE INVENTION

Embodiments are directed to an encapsulated circuit board assembly that includes a circuit board assembly and a thermoformed sheet. The circuit board assembly includes a substrate with a first surface and one or more electronic components mounted to the first surface to form an irregularly contoured front side of the circuit board assembly. The thermoformed sheet encapsulates the irregularly contoured front side of the circuit board assembly. Vacuum forming and pressure forming methods are used to apply a thermoformable sheet to the irregularly contoured front side of the circuit board assembly.

In an aspect, a method of forming an encapsulated circuit board assembly is disclosed. The method includes providing a circuit board assembly and providing a thermoformable sheet. The circuit board assembly comprises a substrate have a first surface and one or more electronic components mounted to the first surface to form an irregularly contoured front side of the circuit board assembly. The method also includes positioning the thermoformable sheet over the irregularly contoured front side of the circuit board assembly, heating the thermoformable sheet to a point of pliability, and applying a vacuum to draw the thermoformable sheet toward and onto the irregularly contoured front side of the circuit board assembly to encapsulate the irregularly contoured front side of the circuit board assembly with the thermoformable sheet. In some embodiments, the thermoformable sheet overlaps an entirety of the irregularly contoured front side of the circuit board assembly. In some embodiments, the thermoformable sheet has a footprint at least as large as to cover a footprint of the first surface of the substrate. In some embodiments, the footprint of the thermoformable sheet is greater than a footprint of first surface of the substrate, and the method further comprises cutting away that portion of the thermoformable sheet that extends beyond the first surface of the substrate. In some embodiments, the method also includes curing the thermoformable sheet after applying the vacuum. In some embodiments, vacuuming the thermoplastic sheet onto the irregularly contoured front side of the circuit board assembly contours the thermoplastic sheet to substantially match a contour of the irregularly contoured front side of the circuit board assembly. In some embodiments, vacuum is applied from an opposite side of the circuit board assembly as the irregularly contoured front side. In some embodiments, the substrate further comprises a second surface on an opposite side of the substrate as the first surface, and one or more through holes extending through the substrate from the first surface to the second surface, wherein applying the vacuum includes drawing air from between the thermoformable sheet positioned over the irregularly contoured front side of the circuit board assembly and through the one or more through holes. In some embodiments, positioning the thermoformable sheet over the irregularly contoured front side of the circuit board assembly comprises securing the thermoformable sheet in a frame, mounting the circuit board assembly to a circuit board assembly carrier, and aligning the frame and the circuit board assembly carrier to position the thermoformable sheet over the irregularly contoured front side of the circuit board assembly. In some embodiments, the method also includes moving the frame toward the mounted circuit board assembly while vacuum is applied. In some embodiments, the method also includes moving the circuit board assembly carrier toward the secured thermoformable sheet while vacuum is applied. In some embodiments, the method also includes moving the frame and the circuit board assembly carrier toward each other while vacuum is applied. In some embodiments, the method also includes applying air pressure to an opposite side of the thermoformable sheet as the positioned circuit board assembly while vacuum is applied. In some embodiments, applying air pressure comprises positioning an air pressure guide over the thermoformable sheet, and injecting air onto the opposite side of the thermoformable sheet via the air pressure guide.

In another aspect, an encapsulated circuit board assembly is disclosed. The encapsulated circuit board assembly includes a circuit board and a thermoformed sheet. The circuit board assembly comprises a substrate have a first surface and one or more electronic components mounted to the first surface to form an irregularly contoured front side of the circuit board assembly. The thermoformed sheet encapsulates the irregularly contoured front side of the circuit board assembly with the thermoformed sheet. In some embodiments, the thermoformed sheet overlaps an entirety of the irregularly contoured front side of the circuit board assembly. In some embodiments, the thermoformed sheet has a footprint at least as large as to cover a footprint of the first surface of the substrate. In some embodiments, a contour of the thermoformed sheet substantially matches a contour of the irregularly contoured front side of the circuit board assembly. In some embodiments, the substrate further comprises a second surface on an opposite side of the substrate as the first surface, and one or more through holes extending through the substrate from the first surface to the second surface, wherein each of the one or more through holes is void of material to allow air to be drawn through the through hole when vacuum is applied.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an encapsulated PCBA and method of encapsulating the PCBA. Those of ordinary skill in the art will realize that the following detailed description of the encapsulated PCBA and method of encapsulating the PCBA is illustrative only and is not intended to be in any way limiting. Other embodiments of the encapsulated PCBA and method of encapsulating the PCBA will readily suggest themselves to such skilled persons having the benefit of this disclosure.

Reference will now be made in detail to implementations of the encapsulated PCBA and method of encapsulating the PCBA as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
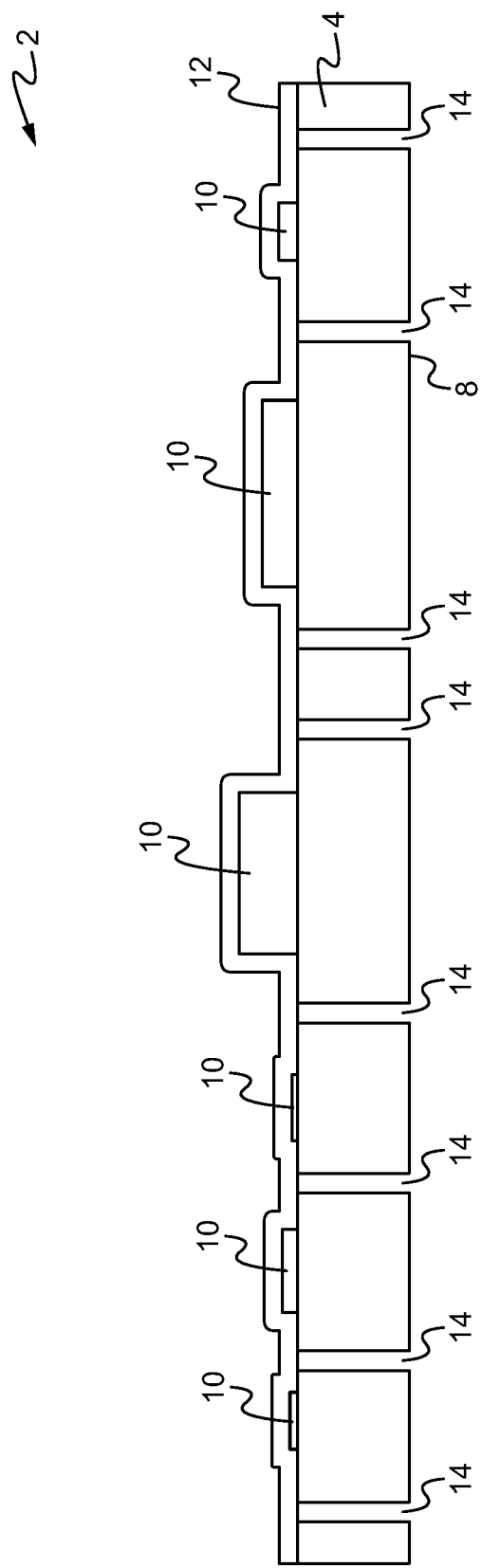
FIG. 1 illustrates a cut out side view of an encapsulated PCBA according to some embodiments.

FIG. 1 illustrates a cut out side view of an encapsulated PCBA according to some embodiments. The encapsulated PCBA includes a PCB 4 having a front side 6 and a back side 8. Discrete electronic components 10 are attached to the front side 6. An electronic component can be any conventional active or passive electronic component, or combination of multiple electronic components, including, but not limited to, IC devices, capacitors, resistors, power supplies, or the like. An IC device can be any type of conventional assembly of electronic components, fabricated as a single unit, which includes miniaturized active devices, for example transistors and diodes, and passive devices, for example capacitors and resistors, and their interconnections. The front side of the PCBA to be encapsulated has an irregular contour due to the various positions, sizes, shapes, numbers, and types of the mounted electronic components. Although not shown in the figure, the PCB can include conductive interconnects formed on either or both the front side and back side of the PCB, as well as conductive interconnects, conductive planes, and conductive vias within the inner layers of the PCB. The PCB includes one or more through holes. The PCB 4 and attached electronic components 10 collectively form a PCBA. A thermoformable sheet 12 is formed over the front side 6 and attached electronic components 10. As shown in FIG. 1, there are a plurality of through holes 14. The plurality of through holes may be an optional feature depending on the type of method used to form the encapsulated PCBA, as described below.

The thermoformable sheet is made of a thermoformable material. Example thermoformable materials include, but are not limited to, polycarbonate (PC), formable PET (polyethylene terephthalate), and similar thermoformable materials. Due to the vacuum forming and pressure forming methods described herein, the thermoformable sheet 12 has a contour that substantially matches a contour of the front side PCB surface and mounted electronic components. The thermoformable sheet 12 also has a substantially uniform thickness. In some embodiments, the through holes are uniformly distributed throughout the PCB. In other embodiments, the through holes are non-uniformly distributed throughout the PCB. In general, the greater the number of through holes, and the closer the positions of the through holes relative to each of the mounted electronic components, the more effective the vacuum pressure can be applied to the thermoformable sheet and the more the thermoformable sheet can be shaped to match, or substantially match, a contour of the front side of the PCB and mounted electronic components.

Although the structure shown in FIG. 1 is described as an encapsulated PCB, it is understood that the thermoformable sheet can be applied to any type of circuit board, either flexible, semi-flexible, or rigid, or even more generally to any type of substrate, that includes one or more electronic components mounted to at least one side that is to be encapsulated. Although description is directed to a PCB and PCBA, it is understood that the concepts, structures, and processes described herein can be applied to other types of circuit boards, circuit board assemblies, substrates, or substrate assemblies.

Figure 2:
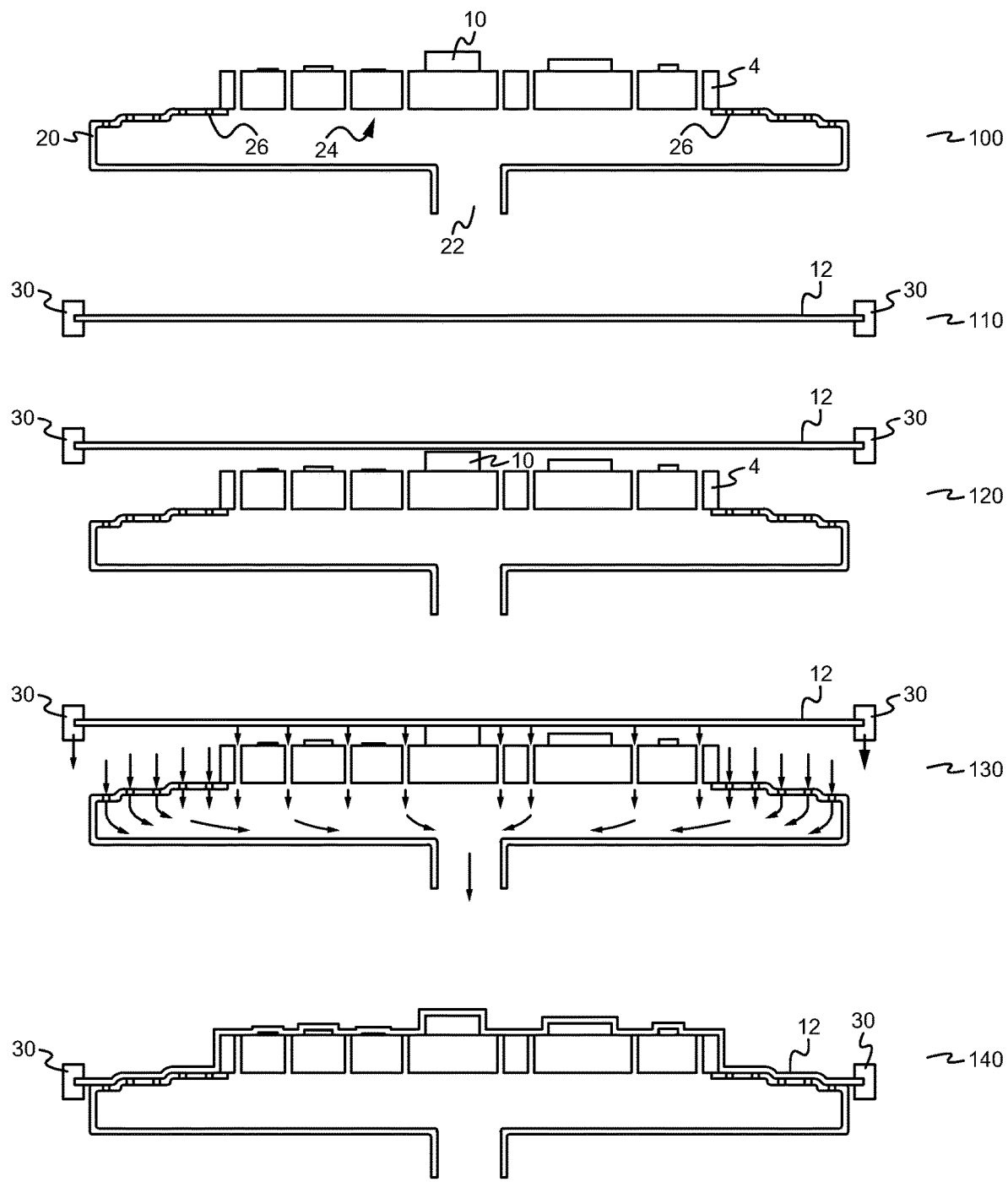
FIG. 2 illustrates an exemplary process flow for encapsulating a PCBA according to some embodiments.

There are various process methodologies that can be used to make the encapsulated PCBA. FIG. 2 illustrates an exemplary vacuum forming process flow for encapsulating a PCBA according to some embodiments. The process steps shown in FIG. 2 are described in relation to the encapsulated PCBA 2 of FIG. 1. It is understood that the process can be used to manufacture alternative encapsulated PCBAs, or substrates with mounted electronic components. The exemplary structures shown for particular process steps are cut out side views of the encapsulated PCBA and PCBA carrier according to the various process steps. At the step 100, the PCBA 4 is mounted to a PCBA carrier 20. The PCBA carrier 20 is a jig or other structure having a primary opening 24 over which the PCBA 4 is positioned. The PCBA carrier 20 also includes secondary openings 26, or through holes, positioned outside a footprint of the PCBA 4. The PCBA carrier 20 further includes an air outlet opening 22 to which a vacuum (not shown) can be attached.

At the step 110, the thermoformable sheet 12 is held in position by a carrier machine, for example using a frame 30 secured to some or all of the perimeter of the thermoformable sheet 12. At the step 120, the thermoformable sheet 12 is positioned over the front side of the PCBA 4 previously mounted to the PCBA carrier 20 at the step 100. In some embodiments, the thermoformable sheet 12 is precut having an oversized shape that is larger than a footprint of the PCBA 4 and is large enough to at least completely cover the active surface, for example the front side 6, of the PCBA 4 once vacuum formed onto the PCBA active surface. In some embodiments, the oversized shape of the thermoformable sheet is large enough that after the vacuum forming is completed excess thermoplastic sheet extends beyond a footprint of the PCBA. This excess portion enables the thermoplastic sheet to be held in proper position by the carrier machine. After the vacuum forming step is completed, the excess portion of the thermoplastic sheet is trimmed away.

At the step 130, the thermoformable sheet 12 is heated, vacuum is applied at the air outlet opening 22, and the frame 30 is lowered toward the PCBA 4. Alternatively, the vacuum can be applied after the frame 30 is lowered into position. Heating the thermoformable sheet makes the thermoformable sheet pliable. The heating step can be done before or after moving the thermoplastic sheet over the PCBA. In some embodiments, a heater (not shown) can be positioned over and/or adjacent to the thermoplastic sheet. Application of vacuum draws air from above the PCBA 4 and the PCBA carrier 20, through the through hole openings 14 on the PCBA 4 and the through hole openings 24, 26 in the PCBA carrier 20, and out the air outlet opening 22 as indicated by the arrows shown in FIG. 2. Lowering of the frame 30 drapes the thermoformable sheet 12 over the PCBA 4 and the PCBA carrier 20, and application of the vacuum further draws select portions of the thermoformable sheet 12 to the front side 6 of the PCBA 4 so that the thermoformable sheet 12 conforms to a contour of the front side 6 and mounted electronic components 10, as shown at the step 140. Following the vacuum forming step, the thermoformable sheet has a three-dimensional shape that matches contour of the front side of the PCBA including the mounted electronic components. In this manner, the front side of the PCBA including the mounted electronic components functions as a mold used during the thermoforming/vacuum forming of the thermoformable sheet to the PCBA front side.

At the step 140, the thermoformable sheet 12 is cured. In some embodiments, the thermoformable sheet 12 is cured by cooling, or otherwise allowed to cool from its heated state used to thermoform. In the case where a heater is applied to the thermoformable sheet during the vacuum forming step, the heater is removed to allow the thermoformable sheet to cool and cure. After the thermoformable sheet 12 is cured in place on the PCBA 4, the thermoformable sheet 12 is cut, and the encapsulated PCBA 2 is removed from the PCBA carrier 20. In some embodiments, the thermoformable sheet 12 is cut around a perimeter of the PCBA 4, such as shown in FIG. 1. A further trimming step can be performed to remove additional excess thermoformable sheet material, if necessary. Although not shown in FIG. 1 or 2, an overmold or other protective layer can be applied on the opposite side (bottom side) of the PCBA 4.

Figure 3:
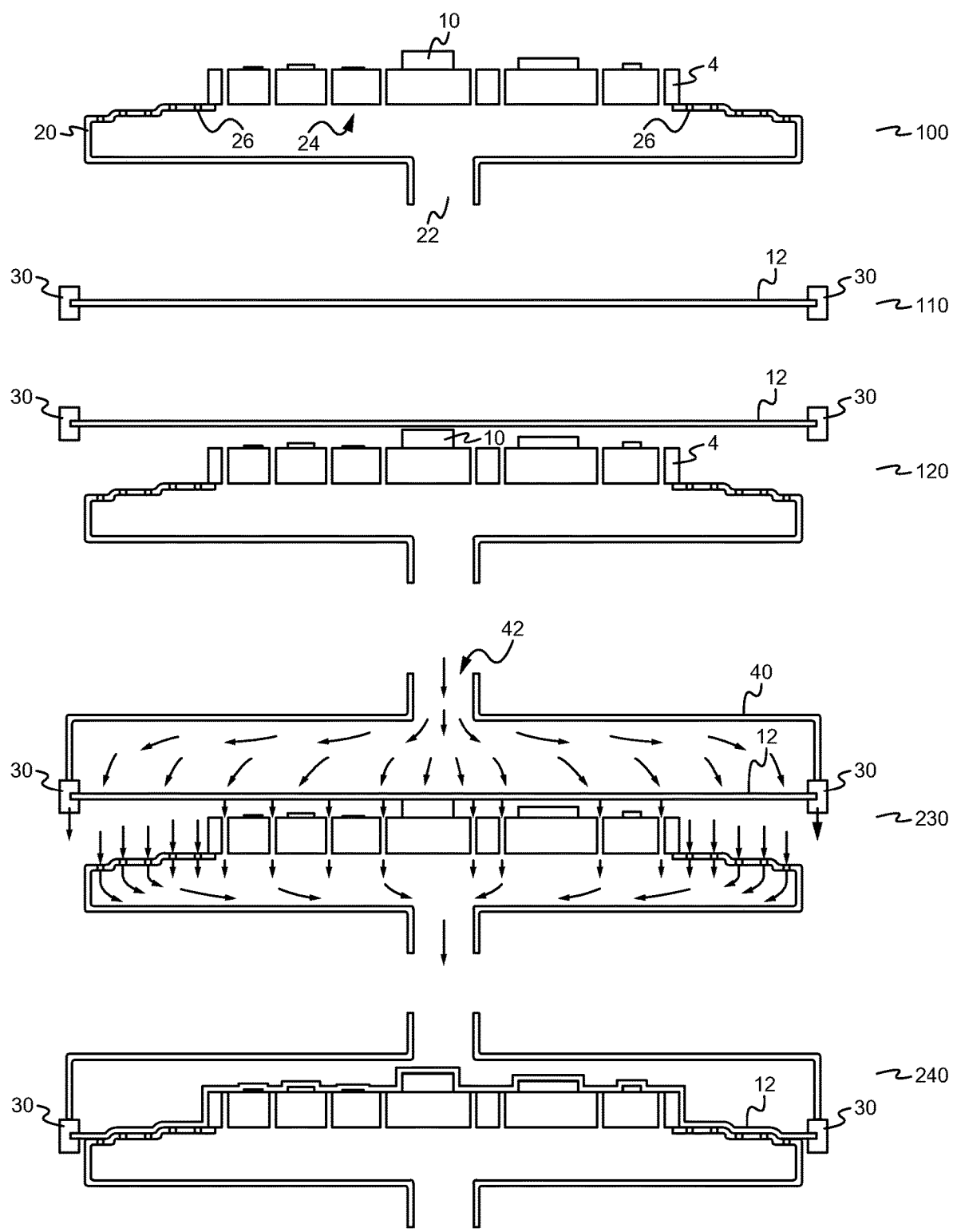
FIG. 3 illustrates another exemplary process flow for encapsulating a PCBA according to some embodiments.

In the vacuum pressure embodiment described in relation to the process of FIG. 2, a vacuum is applied at an opposite side (back side) of the PCBA as the thermoformable sheet being applied to the PCBA. Alternatively, both a vacuum can be applied from below the PCBA and apply air pressure can be applied from above. FIG. 3 illustrates an exemplary pressure forming process flow for encapsulating a PCBA according to some embodiments. The process steps shown in FIG. 2 are similar to those shown in FIG. 3 except the pressure forming process shown in FIG. 3 includes the use of both vacuum from one side of the PCBA and applying air pressure from the other side. The steps 100, 110, and 120 are the same for the pressure forming process as for the vacuum forming process of FIG. 2. In particular, the The PCBA 4 is mounted to the PCBA carrier 20 at the step 100, the thermoformable sheet 12 is held in position by the carrier machine at the step 110, and the thermoformable sheet 12 is positioned over the front side of the PCBA 4 at the step 120.

At the step 230, an air pressure guide 40 is positioned over the thermoformable sheet 12. In some embodiments, the air pressure guide 40 is a separate component from the frame 30. In other embodiments, the air pressure guide is formed as part of the frame. The air pressure guide 40 includes an air inlet opening 42 to which an air hose (not shown), or other pressurized air source, can be attached. A variety of different types of gases can be injected, such as regular air or nitrogen, depending on the application. The thermoformable sheet 12 is heated, vacuum is applied at the air outlet opening 22, air is injected into the air inlet opening 42, and the frame 30 and air pressure guide 40 are lowered toward the PCBA 4. Alternatively, the vacuum and injected air can be applied after the frame 30 and air pressure guide 40 are lowered into position. The heating step can be done before or after moving the thermoplastic sheet over the PCBA. In some embodiments, a heater (not shown) can be positioned over and/or adjacent to the thermoplastic sheet. Application of vacuum draws air from above the PCBA 4 and the PCBA carrier 20, through the through hole openings 14 on the PCBA 4 and the through hole openings 24, 26 in the PCBA carrier 20, and out the air outlet opening 22 as indicated by the arrows shown in FIG. 3. Concurrently, injection of air into the air inlet opening 42 forces are against the thermoformable sheet 12 Lowering of the frame 30 drapes the thermoformable sheet 12 over the PCBA 4 and the PCBA carrier 20, and application of the vacuum further draws select portions of the thermoformable sheet 12 to the front side 6 of the PCBA 4, while application of injected air forces the select portions of the thermoformable sheet to the front side 6 so that the thermoformable sheet 12 conforms to a contour of the front side 6 and mounted electronic components 10, as shown at the step 240.

At the step 240, the thermoformable sheet 12 is cured. The thermoformable sheet 12 can be cured with either the air pressure guide 40 remaining in position above the thermoformable sheet 12, as shown in FIG. 3, or the air pressure guide 40 is removed before curing. In some embodiments, the thermoformable sheet 12 is cured by cooling, or otherwise allowed to cool from its heated state used to thermoform. In the case where a heater is applied to the thermoformable sheet during the pressure forming step, the heater is removed to allow the thermoformable sheet to cool and cure. After the thermoformable sheet 12 is cured in place on the PCBA 4, the thermoformable sheet 12 is cut, and the first encapsulated PCBA 2 is removed from the PCBA carrier 20. In some embodiments, the thermoformable sheet 12 is cut around a perimeter of the PCBA 4, such as shown in FIG. 1. A further trimming step can be performed to remove additional excess thermoformable sheet material, if necessary. Although not shown in FIG. 1 or 2, an overmold or other protective layer can be applied on the opposite side (bottom side) of the PCBA 4.

The substrate of the PCBA has one or more through holes openings. The more through holes openings, and the more distributed the through holes openings, the more effective the applied vacuum is at forcing the thermoformable sheet to conform to the contour of the PCBA surface being encapsulated. In the pressure forming embodiment, where both a vacuum pressure is applied to "pull" the thermoformable sheet toward the PCBA and an air jet pressure is applied above the thermoformable sheet to "push" the thermoformable sheet toward the PCBA, less through holes openings can be used than the vacuum pressure embodiment to achieve the same result due to the air jet pressure.

In the pressure forming embodiment, the type of pressure applied to the top side of the thermoformable sheet is an applied air pressure. The applied air pressure is effective due to air's ability to match a changing contour of the thermoformable sheet as the sheet contours to the underlying PCBA surface, including the electronic components attached to the PCB surface, thereby enabling the applied air pressure to apply a uniformly distributed pressure across the thermoformable sheet top surface throughout the pressure forming process. This characteristic also enables the pressure forming process to be applied generally to any contoured PCBA. For a rigid physical object to be used to apply such downward pressure, a customized template that matches a contour of the PCBA surface is needed.

In some vacuum forming processes, such as the vacuum forming process described above in regard to FIG. 2, the PCB includes a plurality of through holes, such as shown in FIG. 1. Through holes can also be used in some pressure forming processes, such as the pressure forming process described above in regard to FIG. 3. Alternatively, it may not be necessary to include through holes in the PCB and still form the thermoformable sheet over the front side of the PCB and attached electronic components. For example, in some vacuum forming processes a vacuum can be applied at one or more points along the PCB outer perimeter, such as by using a vacuum nozzle applied at each of the one or more outer perimeter points. In some pressure forming processes, pressure applied to force the thermoformable sheet toward the PCB may be sufficient without having through holes and vacuum applied from the opposite side of the PCB drawing air through the through holes. In still other pressure forming processes, vacuum can be applied at one or more points along the PCB outer perimeter, without the PCB having through holes and applying vacuum from the opposite side of the PCB. Use of such alternative methods, or the inclusion of through holes and use of vacuum applied at one or more outer perimeter points of the PCB, can also enable encapsulation of the PCB on both sides of the PCB, where electronic components may be attached to both sides of the PCB. In the case of a PCB having electronic components attached on both sides, a first side can be encapsulated using any of the methods described above, with the inclusion or exclusion of the through holes. However, where the method is applied to a PCB with through holes, encapsulation of the second side can not benefit from the use of the through holes because the through holes will be blocked by the encapsulating thermoformable sheet previously formed on the first side. To overcome this, air can be extracted by applying vacuum at one or more points along the PCB outer perimeter to remove air from between the second side and a thermoformable sheet being applied to the second side.

The PCBA can include a PCB that is either rigid, flexible, or rigid-flex. In general, the approach can be applied to encapsulating a rigid, flexible, or rigid-flex circuit board assembly. In the examples described above and shown in FIGS. 2 and 3, the PCB carrier supports the PCB at the outer perimeter of the PCB, this insures that the through holes are not blocked by the PCB carrier. The PCB carrier can be alternatively configured to provide interior support of the PCB, in such a configuration the PCB carrier is designed so as not to block the through holes of the PCB. This alternatively configured PCB carrier provides additional support for PCBs lacking sufficient rigidity to be solely supported at their outer perimeters, as with flexible or rigid-flex circuit board assemblies.

At least the following advantages are afforded by the instant disclosure: 1) The encapsulation method uses a thin thermoformable sheet, or multiple thermoformable sheets, to cover and protect the PCBA. The thermoformable sheet is applied while in a solid phase. In contrast, the conformal film of conventional techniques is applied while in a liquid phase that is either brush applied over the PCBA or is aerosolized and sprayed onto the PCBA. The thermoformable sheet is more reliable in terms of complete coverage and conformity. 2) The thermoformable sheet can be thicker than conformal coating, and as such is more resistant to mechanical abrasion. In some embodiments, the thermoformable sheet also has a substantially uniform thickness across the applied surfaces of the PCB and attached electronic components. This distinguishes over conventional over-molding techniques where the resulting overmold layer does not have a uniform thickness unless the mold is custom made with a matching contour of the PCBA that is being over-molded. Conventional methods of molding can include, but are not limited to, low pressure molding (LPM), injection molding, compression molding, transfer molding, or the like. 3) Better quality inspection is enabled than when inspecting conformal coatings. 4) Better water resistance (in terms of water pressure values). 5) The thermoformed sheet can be visually opaque to prevent visual inspection of the PCBA design and properties. 6) The thermoformed sheet can help detecting if the PCBA was tampered with, for example if the sheet is torn. 7) Additional features can be added to the thermoformed sheet, for example conductive traces that are printed on the sheet. These traces can serve as a part of a tampering detection system or even as an RF shield.

The present application has been described in terms of specific embodiments incorporating details to facilitate the understanding of the principles of construction and operation of the encapsulated PCBA and method of encapsulating the PCBA. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of forming an encapsulated circuit board assembly comprising:
   a. providing a circuit board assembly, wherein the circuit board assembly comprises a substrate have a first surface and one or more electronic components mounted to the first surface to form an irregularly contoured front side of the circuit board assembly, wherein the substrate further comprises a second surface on an opposite side of the substrate as the first surface, and one or more through holes extending through the substrate from the first surface to the second surface;
   b. providing a thermoformable sheet;
   c. positioning the thermoformable sheet over the irregularly contoured front side of the circuit board assembly;
   d. heating the thermoformable sheet to a point of pliability; and
   e. applying a vacuum to draw the thermoformable sheet toward and onto the irregularly contoured front side of the circuit board assembly to encapsulate the irregularly contoured front side of the circuit board assembly with the thermoformable sheet, wherein applying the vacuum includes drawing air from between the thermoformable sheet positioned over the irregularly contoured front side of the circuit board assembly and through the one or more through holes.

2. The method of claim 1 wherein the thermoformable sheet overlaps an entirety of the irregularly contoured front side of the circuit board assembly.

3. The method of claim 1 wherein the thermoformable sheet has a footprint at least as large as to cover a footprint of the first surface of the substrate.

4. The method of claim 1 wherein the footprint of the thermoformable sheet is greater than a footprint of first surface of the substrate, and the method further comprises cutting away that portion of the thermoformable sheet that extends beyond the first surface of the substrate.

5. The method of claim 1 further comprising curing the thermoformable sheet after applying the vacuum.

6. The method of claim 1 wherein vacuuming the thermoplastic sheet onto the irregularly contoured front side of the circuit board assembly contours the thermoplastic sheet to substantially match a contour of the irregularly contoured front side of the circuit board assembly.

7. The method of claim 1 wherein vacuum is applied from an opposite side of the circuit board assembly as the irregularly contoured front side.

8. The method of claim 1 wherein positioning the thermoformable sheet over the irregularly contoured front side of the circuit board assembly comprises securing the thermoformable sheet in a frame, mounting the circuit board assembly to a circuit board assembly carrier, and aligning the frame and the circuit board assembly carrier to position the thermoformable sheet over the irregularly contoured front side of the circuit board assembly.

9. The method of claim 8 further comprising moving the frame toward the mounted circuit board assembly while vacuum is applied.

10. The method of claim 8 further comprising moving the circuit board assembly carrier toward the secured thermoformable sheet while vacuum is applied.

11. The method of claim 8 further comprising moving the frame and the circuit board assembly carrier toward each other while vacuum is applied.

12. The method of claim 1 further comprising applying air pressure to an opposite side of the thermoformable sheet as the positioned circuit board assembly while vacuum is applied.

13. The method of claim 12 wherein applying air pressure comprises positioning an air pressure guide over the thermoformable sheet, and injecting air onto the opposite side of the thermoformable sheet via the air pressure guide.

14. An encapsulated circuit board assembly comprising:
   a. a circuit board assembly comprises a substrate have a first surface and one or more electronic components mounted to the first surface to form an irregularly contoured front side of the circuit board assembly, wherein the substrate further comprises a second surface on an opposite side of the substrate as the first surface, and one or more through holes extending through the substrate from the first surface to the second surface, wherein each of the one or more through holes is void of material to allow air to be drawn through the through hole when vacuum is applied; and
   b. a thermoformed sheet that encapsulates the irregularly contoured front side of the circuit board assembly with the thermoformed sheet.

15. The encapsulated circuit board assembly of claim 14 wherein the thermoformed sheet overlaps an entirety of the irregularly contoured front side of the circuit board assembly.

16. The encapsulated circuit board assembly of claim 14 wherein the thermoformed sheet has a footprint at least as large as to cover a footprint of the first surface of the substrate.

17. The encapsulated circuit board assembly of claim 14 wherein a contour of the thermoformed sheet substantially matches a contour of the irregularly contoured front side of the circuit board assembly.

* * * * *